Figure 1:
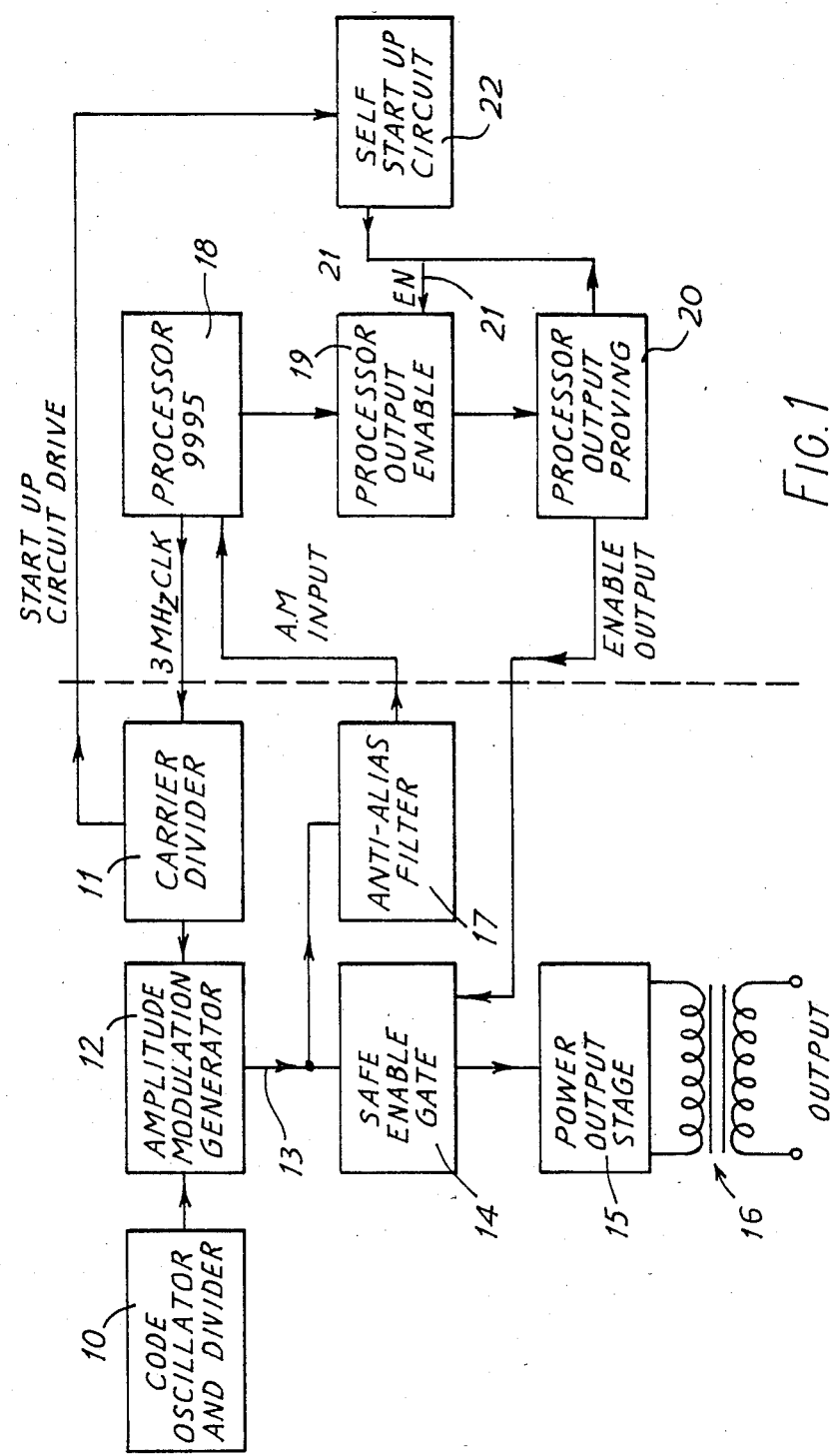

United States Patent [19]

Badge et al.

[11] Patent Number: 4,672,223
[45] Date of Patent: Jun. 9, 1987

[54] PROVING SAFE OPERATION

[75] Inventors: Roger Badge, Bristol; David W. Cowen, Corsham, both of England

[73] Assignee: Westinghouse Brake & Signal Company, Limited, Chippenham, England

[21] Appl. No.: 635,005

[22] Filed: Jul. 27, 1984

[30] Foreign Application Priority Data

Jul. 29, 1983 [GB] United Kingdom ................. 8320509

[51] Int. Cl.$^4$ ............................................. B61L 11/02
[52] U.S. Cl. .......................................... 307/3; 246/40; 246/125; 307/9
[58] Field of Search .................... 307/3, 105, 106, 108, 307/115, 116, 142, 143, 140, 9; 364/426; 246/28 F, 167 R, 182 A, 182 B, 182 C, 175, 325, 326, 182 R, 26, 40; 125; 340/52 F, 310 R, 310 A

[56] References Cited

U.S. PATENT DOCUMENTS

| | | | |
|---|---|---|---|
| 3,749,994 | 7/1973 | Matty | 246/182 C X |
| 3,772,640 | 11/1973 | Auer et al. | 246/63 C X |
| 3,777,139 | 12/1973 | Peel | 246/125 |
| 3,781,541 | 12/1973 | Darrow et al. | 246/125 X |
| 3,819,933 | 6/1974 | Grundy | 246/40 X |
| 3,819,949 | 6/1974 | Ueda et al. | 307/10 R |
| 3,828,225 | 8/1974 | Grundy | 246/182 B X |
| 3,829,682 | 8/1974 | Geiger | 246/125 |
| 3,838,271 | 9/1974 | Ackard et al. | 246/125 |
| 3,846,639 | 11/1974 | Ueda et al. | 307/9 |
| 3,891,833 | 6/1975 | Rhoton et al. | 364/426 |
| 3,909,632 | 9/1975 | Sibley | 246/125 X |
| 3,919,537 | 11/1975 | Bynum | 364/426 X |
| 3,927,852 | 12/1975 | Sibley | 246/125 X |
| 4,002,314 | 1/1977 | Barpal | 246/63 C |
| 4,015,082 | 3/1977 | Matty et al. | 364/426 |
| 4,081,160 | 3/1978 | Devy et al. | 246/167 R X |
| 4,093,162 | 6/1978 | Takaoka et al. | 364/426 X |
| 4,320,881 | 3/1982 | Campbell | 246/121 X |
| 4,410,154 | 10/1983 | Matty | 364/426 X |
| 4,459,668 | 7/1984 | Inoue et al. | 364/426 |
| 4,467,430 | 8/1984 | Even et al. | 246/40 X |
| 4,494,717 | 1/1985 | Corrie et al. | 246/28 F |
| 4,499,543 | 2/1985 | Matsuda | 364/426 |
| 4,516,249 | 5/1985 | Cook et al. | 375/82 X |

FOREIGN PATENT DOCUMENTS 2017991 7/1982 United Kingdom .

Primary Examiner—William M. Shoop, Jr.
Assistant Examiner—Shik Luen Paul Ip
Attorney, Agent, or Firm—Beehler, Pavitt, Siegemund, Jagger, Martella & Dawes

[57] ABSTRACT

To ensure the safe operation of an electronic circuit, for example an amplitude modulated carrier signal generator, an output of the circuit is analyzed to prove the presence of predetermined signal characteristics, for example the carrier signal, or a modulation frequency. The predetermined signal alternatively may be superimposed on an input to the electronic signal and proved subsequently to be present in the output. The output of the circuit is passed inhibited, according to whether or not the signal characteristics are proved present, by means of an output enable gate which is self-latching providing the output continues to be proved correct. A start-up circuit delays a possible inhibit for a limited period following initial power connection to the circuit in order that the output can become established.

2 Claims, 3 Drawing Figures

PROVING SAFE OPERATION

The invention relates to proving safe operation and failure to safety of electronic circuits.

Safe operation in the context of the present invention includes correct operation of the apparatus and also, in the event of an error being detected or a fault occuring, the automatic switching of the output of the apparatus into a safe state.

The invention is particularly useful in systems where a decision concerning safety is based upon the output signal, so that incorrect operation of the signal processing circuits producing that signal can directly affect the safety of the system. For example, a mass transit system, such as an underground railway, having an automatic train protection system in which a coded signal representing safe maximum train speed is transmitted to the train for analysis by the train and comparison with a signal representing the train's measured speed. If the coded signal is incorrectly decoded or is corrupted before comparison then a wrong decision concerning the maximum speed at which it is safe for the train to travel may be the result. One receiver apparatus for an automatic train protection system of this type is described in U.K. Patent No. 2,017,991B assigned to the same assignee as this application.

Also in the railway signalling field, the invention may be useful in coded track circuits in which a coded signal is transmitted between a track circuit transmitter and track circuit receiver via the running rails. When the section of rails, i.e. the track section, is unoccupied the signal reaches the receiver, but when a train is present in the section the rails are electrically shorted together thus preventing propagation of the signal along the section. The present invention may be applied to the receiver apparatus in order to verify its correct operation at all times. A railway track circuit receiver of this type to which the invention may be applied is described in U.S. Pat. No. 4,516,249 assigned to the same assignee as this application. Apparatus comprising an electronic circuit which in correct operation provides an output containing a signal having a predetermined frequency component, the presence of which component in the output provides correct operation of the circuit. Connected in series with the output of the circuit is an output gating means having a first state in which it inhibits the output and a second state to which it is capable of being operated by a gating signal. A detector means connected to receive the output is responsive to the presence in the output of the predetermined frequency component to produce the gating signal to operate the gating means to its second state to pass the output signal, whereby the output from the circuit is inhibited when the predetermined frequency component is not proved present in the output.

Figure 2:
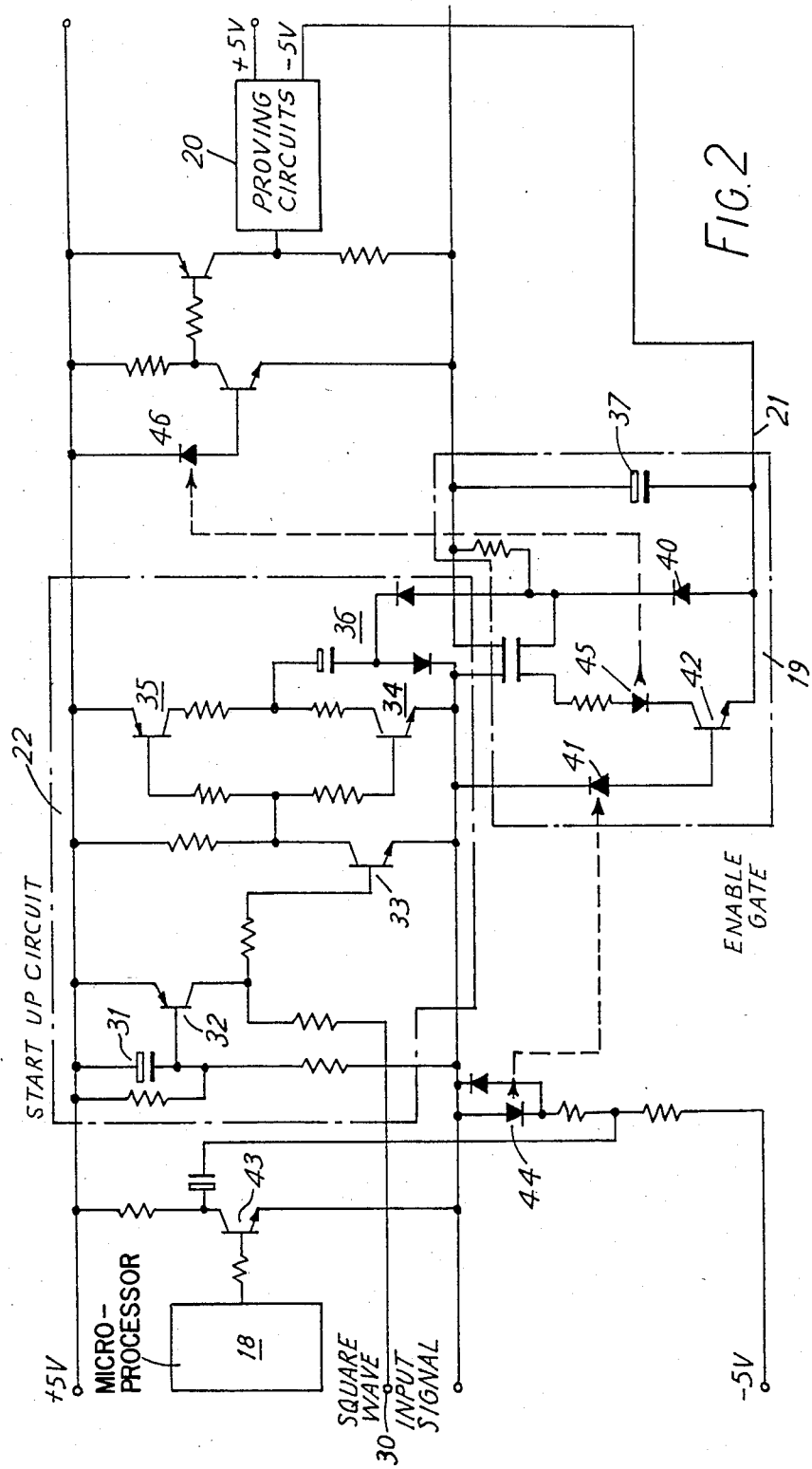
Figure 3:
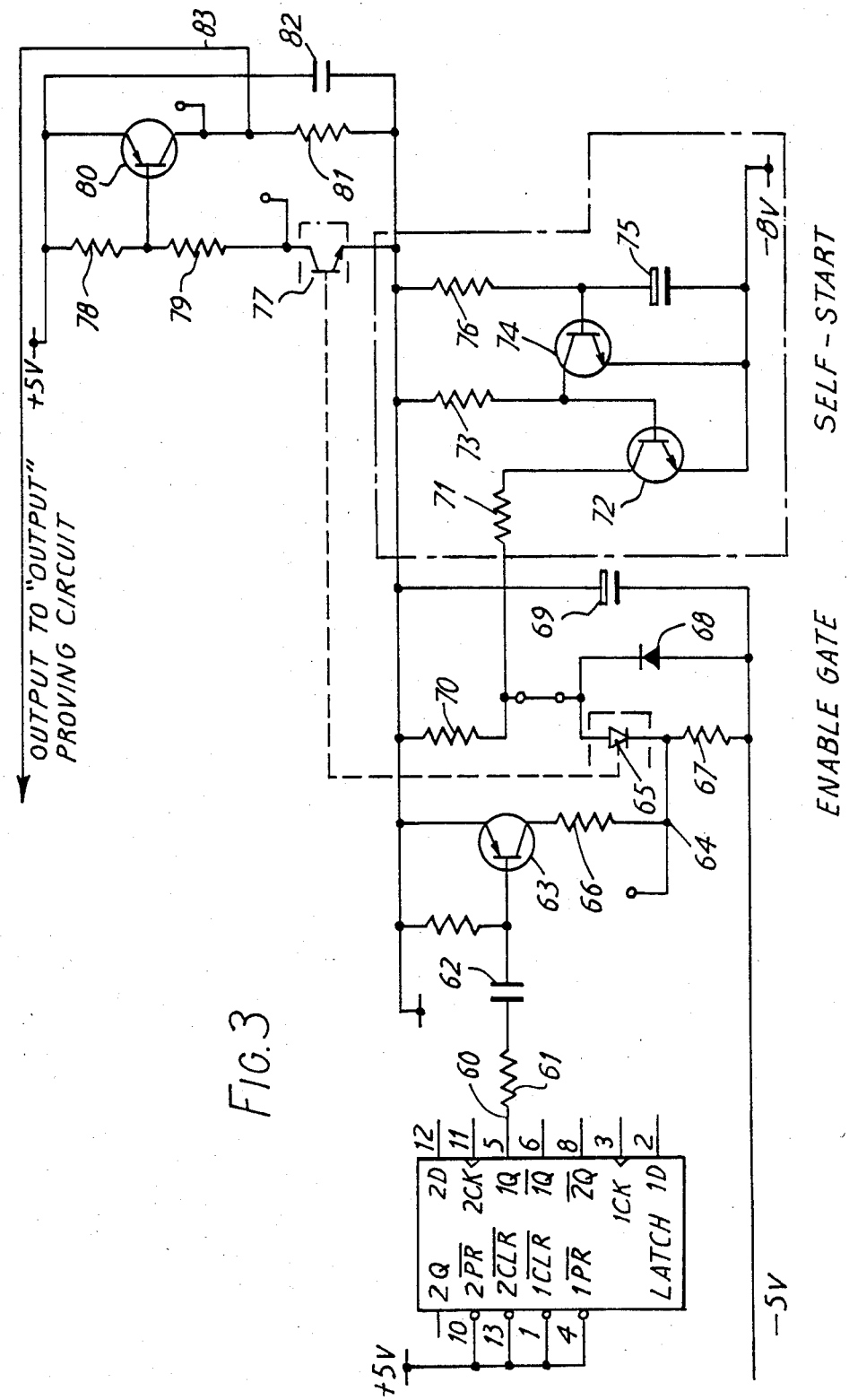

The invention and how it may be carried into practice will now be described, by way of example only, with reference to the accompanying drawings in which:

FIG. 1 shows is a block diagram of a coded carrier signal generator for an ATP transmitter, FIG. 2 shows a circuit diagram of an output gating arrangement for a track circuit receiver, and FIG. 3 shows an alternative gating arrangement for a track circuit receiver.

Referring now to the drawings, two particular embodiments for the invention will be described, a first concerning a railway automatic train protection system (hereinafter referred to as an ATP system) and a second concerning a railway track circuit application, especially useful for coded jointless track circuits. In both these embodiments the means for sensing the characteristics, i.e. the amplitude and frequency of the chosen signal, is realised using a frequency spectrum analyser of a particular type, namely a microprocessor based system adapted to evaluate a fast or discrete Fourier transfom algorithm. Such an apparatus as this is described in the U.S. Pat. No. 4,516,249 assigned to the same assignee as this application. In addition, the technique described in the commonly assigned further U.S. patent application Ser. No. 635,239 (which is concerned with proving the safe operation of a signal channel processor system such as that disclosed in U.S. Pat. No. 4,516,249) and also the technique of the commonly assigned U.S. patent application Ser. No. 635,266 (which is concerned with proving correct operations of electronic circuits, inter alia microprocessors) also find application in combination with the present invention. The above referenced U.S. patent applications Ser. Nos. 635,239 and 635,266, now abandoned, were filed concurrently with the present application of this specification, and references to those applications are to be construed as including reference to any subsequent patent application claiming priority therefrom.

For proving safe operation of each electronic processing circuits there is provided means adapted to generate in the output of an electronic processing circuit an additional signal of predetermined characteristics, or to sense a particular signal characteristic, and a gating arrangement connected to the output including latching means wherein a gate is energised by supplementary supply voltage generated in response to detection of the additional signal.

FIG. 1 shows a block diagram of an ATP transmitter arrangement in which the transmitter circuits themselves have been omitted because they form no part of the present invention. The basic speed indicating code signals are generated by a code oscillator and divider circuits in block 10, one of the codes is selected by means not shown to represent a maximum safe speed limit. The selected coded frequency and a carrier signal from carrier generator 11 are connected to an amplitude modulation generator 12 the amplitude modulated output 13 of which is then connected via a safe enable gate 14 to a power output stage 15, and thence via an output transformer 16 to transmitter circuits (not shown). Compared to a conventional ATP coded signal transmitter only the safe enable gate 14 is added to the signal path by application of the invention.

The greater part of the circuits for carrying out the invention are illustrated to the right of FIG. 1 and comprises an anti-alias filter 17 connected to receive the amplitude modulated signal 13 and connected to the data input of a microprocessor 18. The microprocessor output is connected via a processor output enable gate 19 to a proving circuit 20 the output of which controls operation of the enable gate 14. The proving circuit 20 is also connected to a control input 21 of enable gate 19 to provide a self-latching facility for normal operation. These circuits together provide the safety checks and control during normal running of the transmitter. In addition, and because there is no output signal when the receiver is energised, a start up circuit 22 is provided which receives an input from the carrier generator 11 and provides a signal to the control input 21 of microprocessor output enabling gate 19.

In the particular example being described it is convenient to derive the transmitter carrier signal from the same frequency source as the microprocessor clock, therefore the 3 MHz clock frequency of the microprocessor 18 is connected to the block 11 which consists basically of frequency dividing circuits.

The illustrated arrangement does not include a separate proving signal generator, instead the amplitude modulated frequency which appears in the modulated output 13 is made to serve the same purpose.

The arrangement of FIG. 1 utilizes output gating means in accordance with the invention on a first level to pass the output of the frequency analysing microprocessor 18, and then at a second level utilizes a further gating means 14 to pass the output from the a.m. generator 12. Also, to accommodate the cycle or processing time of the microprocessor system 18, the self start-up circuit 22 provides a time delay greater than one cycle period so that normal operation of the arrangement is established initially. If the processor system is operated in accordance with the invention of Ser. No. 635,239 the delay time is preferably greater than the period of two operating cycles.

In operation of the arrangement of FIG. 1 a transmitter carrier signal modulated by a selected code frequency is generated in the normal way and output signal 13 is connected through a safe enable gate 14 for transmission. The amplitude modulated signal 13 is also connected via a safe anti-alias filter 17 to the data input of a microprocessor 18 which is programmed to perform a digital filtering function by means of a Fast Fourier Transform technique, such a technique is more fully described in the previously mentioned U.S. Pat. No. 4,516,249. The processor output comprises a data signal giving the amplitude levels of the components of the amplitude modulated input signal lying within a multiplicity of frequency bins. This output is connected via an enabling gate 19 to a processor output proving circuit 20 which verifies that the modulated signal contains one of the code frequencies, that said modulating signal has sufficient amplitude and that its frequency lies within a permitted range. Subject to these criteria being met the proving circuit 20 produces outputs one of which maintains the enable gate 14 and another which is fed back to control input 21 to maintain the enable gate 19, the latter thereby constituting a self-latching circuit.

Without a positive output from proving circuit 20 the enable gate 19 will be latched to a state such as to inhibit the output from processor 18 reaching proving circuit 20. Therefore in order to permit the circuit to commence operating when energised initially, the start-up circuit 22 is provided with an output from the carrier signal generator and is arranged to provide an alternative and temporary latching signal to input 21 of gate 19.

In the event that the modulating signal does not possess a permitted frequency, or more than one modulating frequency is detected the proving circuit 20 removes the maintaining signals from gate 14 and gate 19. The former prevents the amplitude modulated signal reaching the power output stage 15, thereby effectively inhibiting the transmitter, and the latter effectively latches-out the proving circuit 20 preventing subsequent restoration of the maintaining signal should the fault prove only to be temporary.

Referring now to FIG. 2, this shows in greater detail a circuit diagram of part of a circuit suitable for use in the general arrangement of FIG. 1, in which the microprocessor output enable gate is enclosed by chain linked line 19, the processor output proving circuits by block 20, and the start up circuit is enclosed by another chain linked line 22. The latching action mentioned above which maintains enable gate 19 is carried into practice by providing 5 volts on the line indicated at reference 21.

In the initial situation of start-up, a signal from the carrier generator 11 (see FIG. 1) is provided at input 30 in the form of a square wave input signal. In the circuit 22 the voltage on the capacitor 31 is initially zero volts when the circuit is switched on, and so the transistor 32 is biased "off" allowing the square wave input signal to switch transistor 33 which drives a further push-pull arrangement of transistors 34, 35. This output of this arrangement is connected to a diode pump circuit comprising capacitors 36, 37 and diodes 38, 39 and 40, in which the anode of diode 40 and one terminal of capacitor 37 is connected to the −5 volt line 21. The enable gate 19 basically comprises a photo-responsive diode 41 connected in the base circuit of a transistor 42 which is connected in parallel with diode 40 and capacitor 37 between the 0 volts and −5 volt lines. The output of microprocessor 18 is connected through a further transistor 43 to drive a light emitting diode 44 optically coupled with the diodes 41. Similarly a light emitting diode 45 in the collector circuit of transistor 42 is optically coupled with a photo-responsive diode 46 connected in an input stage to proving circuit 20.

In operation of the arrangement of FIG. 2 the capacitor 31 is initially discharged, upon initial energisation of the power supply to the circuits and the transmitter a square wave signal appears at input 30 and is permitted to switch transistor 33 which drives the diode pump arrangement to produce −5 volts on line 21. This negative voltage energises transistor 42 and permits the microprocessor output to be relayed via transistor 43, the opto-coupler comprising diodes 41, 44 and the second opto-coupler, of diodes 45, 46 to the proving circuit 20. Gradually capacitor 31 charges up thus inhibiting input 30 from continuing to operate the diode pump circuit. Upon receiving the microprocessor output the proving circuit 20 will generate a −5 volts supply on line 21 providing it has satisfactorily proved the microprocessor output to be correct. Having once been charged the capacitor 31 maintains the bias on transistors 32 and 33 for as long as the normal power supply is maintained. The signal on input 30 is only again permitted to operate the diode pump circuit if the supply voltage source is de-energised and capacitor 31 allowed to discharge.

An alternative circuit for an enable gate and self-start circuit are shown in FIG. 3. The processor system, again represented by single block 18 performs the operations of decimation and evaluation of the transform algorithm on an input waveform. The processor 18 is adapted to check that the amplitude modulated carrier signal comprises only one of a set of possible modulation frequencies and does not include more than one modulation frequency, these frequencies being the preselected signal characteristics. Subject to one of these frequency being sensed the processor system 18 produces an output on line 60 comprising a unipolar amplitude modulated carrier signal of 2.5 KHz modulated at 320 Hz.

The input line 60 is connected through a high pass filter comprising resistor 61 and capacitor 62 to the base terminal of a switching transistor 63. The collector load of this transistor in which a junction point 64 is connected to the cathode of the light emitting part 65 of an optical coupler, the collector load resistors 66 and 67 form a potential divider providing a reference potential to the LED 65. A further anti-parallel diode 68 is connected from the anode of the LED 65 to a negative voltage bias potential −5 volts and reservoir capacitor 69 is connected between here and a reference potential 0 volts supply. A further resistor 70 is connected between the common connected anode and cathode of diodes 65 and 68 respectively to the reference supply. This circuit section constitutes an enable gate.

The circuit node at the anode and cathode of diodes 65 and 68 is also connected through a resistor 71 in the load current path of switching transistor arrangement comprising transistor 72, resistor 73 and transistor 74. The base terminal of the latter transistor is connected to the variable potential terminal of a capacitor 75 and resistor 76 connected to the reference potential. This circuit section constitues a self-start circuit.

The optical coupler is completed by a light receiving transistor 77 connected in an amplifier circuit comprising potential divider 78 and 79, amplifying transistor 80, resistor 81 and capacitor 82 which provides an output at 83 connected to the output proving block 20 of FIG. 1. The proving circuit 20 comprises a rectifier circuit responsive to an alternating signal on line 83 to maintain a latching output signal or enable signal to the gate 14 and the self start circuit 22, see FIG. 1. This enable signal also constitutes the −5 volts supply for the enable gate, see FIG. 3.

In operation, of the circuit of FIG. 3 the capacitors 69 and 75 are initially discharged and in order for the enable gate to operate the diode 65 must be forward biased. In steady state and correct operating conditions the bias potential for diode 65 is obtained from the output 83, via the proving circuit 20 of FIG. 1, and therefore through a fully operational, properly biased optical coupler. It is therefore self-latching in normal steady state operating conditions. When power is initially provided the transistor 74 is biased non-conducting so that transistor 72 conducts and commences charging capacitor 69 through diode 68. This temporary situation maintains a reverse-bias on LED 65 to prevent its operation and thereby block passage of an output signal. As soon as capacitor 75 has charged sufficiently the transistors 74 and 72 assume opposite conduction states. The time constant of the charging path of this capacitor 75 is enough so that capacitor 69 has charged sufficiently to provide enough negative bias potential to forward bias diode 65 which then relays an output signal via transistor 77 to the proving circuit 20 and, if correct, this sustains the negative bias potential or continued operation.

If, or when, the output signal does not energise the proving circuit 20 the capacitor 69 will discharge, through diode 68 and resistor 70, and eventually return reverse bias to diode 65 blocking its further operation, and the enable gate is then latched into its block state.

In a corresponding track circuit receiver embodying the invention there is provided an essentially similar safe latching circuit in the output. A microprocessor is arranged to process the received track circuit signal and to generate either of two correct dynamic outputs according to whether the track section is unoccupied or occupied respectively. A first output consists of an amplitude modulated constant frequency or "carrier" signal and the second output consists of a constant frequency or "carrier" signal only. A third output state comprises any other signal level or frequency and indicates a failure state. Therefore correct operation of the microprocessor output circuits will be proved by the presence of the "carrier" frequency and an additional level of safety provided when the track section is occupied by the extra requirement of detecting the correct modulation level. The output latching circuit is arranged to be responsive to detection of the "carrier" signal and the gating means is connected in the receiver output so that it is disabled in the event of loss of the proving signal.

We claim:

1. A railway automatic train protection system wherein a transmitter circuit for-producing a coded speed signal comprises a carrier signal generator for producing a carrier signal of predetermined frequency, a speed code signal generator, a signal modulator having inputs connected with the carrier signal and the code signal generators and an output connected to a power output stage through gating means, the gating means having a first state in which it inhibits the modulator output signal and a second state in which it passes the said signal and to which it is capable of being operated by a gating signal, and a detector for producing said gating signal, the detector being responsive to the presence in the modulator output of a signal component having the carrier signal frequency to produce a gating signal to operate the gating means to pass the modulator output signal to the transmitter power output stage, whereby the power output from the circuit is inhibited when the carrier signal frequency is not detected in the output of the modulator.

2. A railway track circuit receiver wherein gating means is connected in series with the output of the receiver, the gating means having a first state in which it inhibits the output and a second state to which it is capable of being operated by a gating signal, and detector means having an input connected to receive the track circuit receiver output and an output connected to provide the gating signal, the detector means being responsive to the presence in the track circuit receiver output of a signal component having a predetermined signal frequency to produce a gating signal to operate the gating means to pass the track circuit receiver output, whereby the said output is inhibited when the predetermined signal frequency is not detected in the output of the track circuit.

* * * * *